US012057436B2

(12) United States Patent
Chava et al.

(10) Patent No.: US 12,057,436 B2
(45) Date of Patent: *Aug. 6, 2024

(54) PACKAGE COMPRISING AN INTEGRATED DEVICE CONFIGURED FOR SHAREABLE POWER RESOURCE

(71) Applicant: QUALCOMM Incorporated, San Diego, CA (US)

(72) Inventors: Bharani Chava, San Diego, CA (US); Abinash Roy, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,063

(22) Filed: Aug. 3, 2023

(65) Prior Publication Data

US 2023/0387077 A1 Nov. 30, 2023

Related U.S. Application Data

(63) Continuation of application No. 17/162,621, filed on Jan. 29, 2021, now Pat. No. 11,764,186.

(51) Int. Cl.
*H01L 25/065* (2023.01)
*H01L 23/00* (2006.01)
(Continued)

(52) U.S. Cl.
CPC ...... *H01L 25/0655* (2013.01); *H01L 23/3128* (2013.01); *H01L 23/49822* (2013.01);
(Continued)

(58) Field of Classification Search
CPC .......... H01L 25/0655; H01L 23/49822; H01L 23/58; H03K 17/6871
See application file for complete search history.

(56) References Cited

U.S. PATENT DOCUMENTS 9,761,280 B2 * 9/2017 Kim ........................ G11C 5/143
11,764,186 B2 * 9/2023 Chava ................ H03K 17/6871
327/109
(Continued)

OTHER PUBLICATIONS

International Search Report and Written Opinion—PCT/US2021/06363—ISA/EPO—Apr. 21, 2022.

*Primary Examiner* — Metasebia T Retebo
(74) *Attorney, Agent, or Firm* — Loza & Loza, LLP

(57) ABSTRACT

A package that includes a substrate and integrated device coupled to the substrate. The integrated device includes a first core and a second core. The substrate includes a first power interconnect configured to provide a first electrical path for a first power resource to the first core of the integrated device. The first power interconnect includes a first power plane. The substrate includes a second power interconnect configured to provide a second electrical path for a second power resource to the second core of the integrated device. The second power interconnect includes a second power plane. The substrate includes a switch coupled to the first power interconnect and the second power interconnect, where if the switch is turned on, the switch is configured to enable at least some of the power resource from the second power resource to contribute to the first core of the integrated device.

28 Claims, 12 Drawing Sheets

(51) Int. Cl.
- *H01L 23/31* (2006.01)
- *H01L 23/498* (2006.01)
- *H01L 23/58* (2006.01)
- *H03K 17/687* (2006.01)

(52) U.S. Cl.
CPC .............. *H01L 23/58* (2013.01); *H01L 24/16* (2013.01); *H03K 17/6871* (2013.01); *H01L 2224/16227* (2013.01)

(56) References Cited

U.S. PATENT DOCUMENTS

| | | |
|---|---|---|
| 2012/0147567 A1 | 6/2012 | Lee et al. |
| 2014/0210097 A1* | 7/2014 | Chen ........................ H01L 21/50 257/774 |
| 2022/0246580 A1 | 8/2022 | Chava et al. |

* cited by examiner

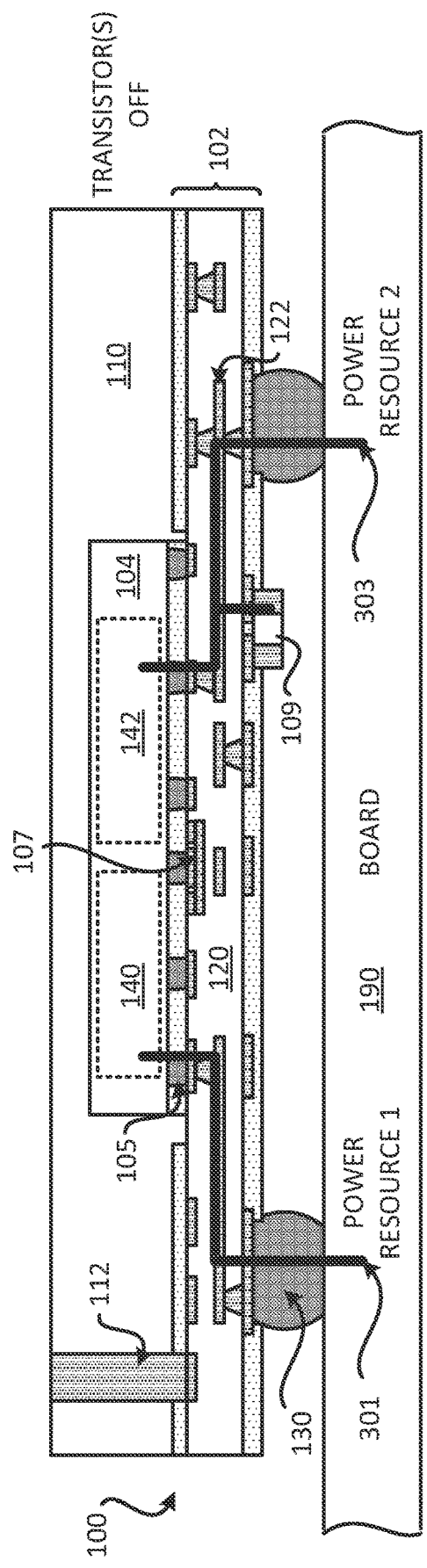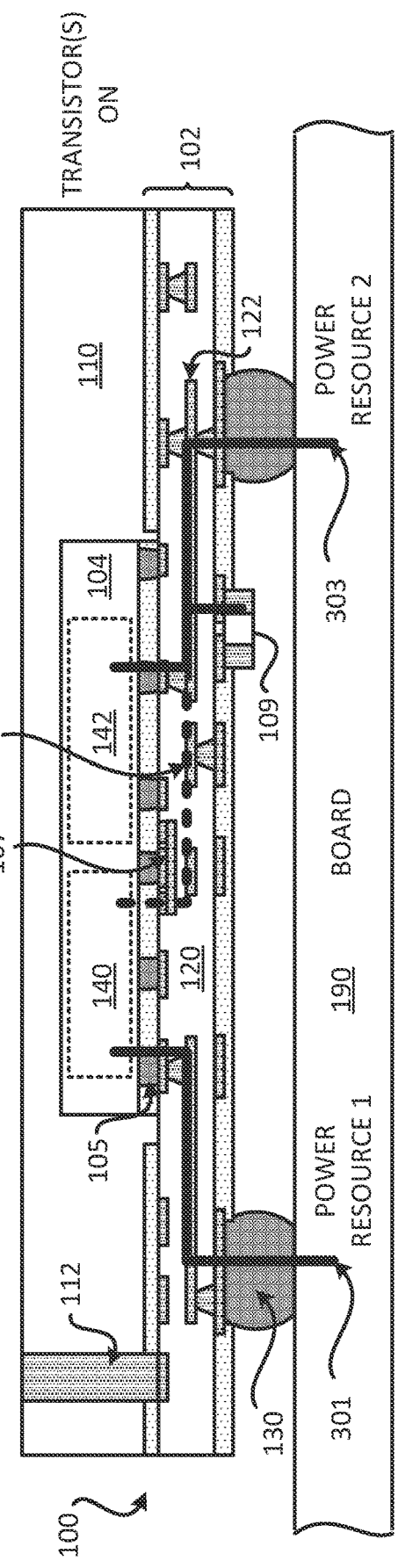

PACKAGE COMPRISING AN INTEGRATED DEVICE CONFIGURED FOR SHAREABLE POWER RESOURCE

CROSS-REFERENCE TO RELATED APPLICATION

The present application claims priority to and is a continuation application to U.S. patent application Ser. No. 17/162,621, filed on Jan. 29, 2021 in the U.S. Patent and Trademark Office, the entire content of U.S. patent application Ser. No. 17/162,621 is incorporated herein by reference as if fully set forth below and for all applicable purposes.

FIELD

Various features relate to packages and substrates, but more specifically to packages that includes substrate and integrated devices.

BACKGROUND

A package may include a substrate and an integrated device. Power to the integrated device may be provided through interconnects of the substrate. How the power to the integrated device is routed through the substrate may affect the performance of the integrated device and the packages. There is an ongoing need to provide packages that take full advantage of the capabilities of the integrated devices.

SUMMARY

Various features relate to packages and substrates, but more specifically to packages that includes substrate and integrated devices.

One example provides a package that includes a substrate and integrated device coupled to the substrate. The integrated device includes a first core and a second core. The substrate includes a first power interconnect configured to provide a first electrical path for a first power source to the first core of the integrated device. The substrate includes a second power interconnect configured to provide a second electrical path for a second power source to the second core of the integrated device. The substrate includes a switch coupled to the first power interconnect and the second power interconnect, where if the switch is turned on, the switch is configured to enable at least some of the power from the second power source to travel to the first core of the integrated device.

Another example provides a package that includes a substrate, a first integrated device coupled to the substrate, and a second integrated device coupled to the substrate. The substrate includes a first power interconnect configured to provide a first electrical path for a first power source to the first integrated device. The substrate includes a second power interconnect configured to provide a second electrical path for a second power source to the second integrated device. The substrate includes a switch coupled to the first power interconnect and the second power interconnect, where if the switch is turned on, the switch is configured to enable at least some of the power from the second power source to travel to the first integrated device.

Another example provides a method that comprises operating an integrated device that includes a first core and a second core, wherein a first power resource is directed to the first core and a second power resource is directed to the second core. The method determines that the first core of the integrated device needs more power. The method turns on at least one switch to reroute some of the second power resource to the first core of the integrated device.

Another example provides a method that comprises operating a first integrated device, where a first power resource is directed to the first integrated device. The method operates a second integrated device, wherein a second power resource is directed to the second integrated device. The method determines that the first integrated device needs more power. The method turns on at least one switch to reroute some of the second power resource to the first integrated device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates an exemplary package with possible electrical paths for a substrate and an integrated device with multiple cores with shareable power resources.

FIG. 4 illustrates an exemplary package with possible electrical paths for a substrate and an integrated device with multiple cores with shareable power resources.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate. The integrated device includes a first core and a second core. The substrate includes a first power interconnect configured to provide a first electrical path for a first power resource to the first core of the integrated device. The substrate includes a second power interconnect configured to provide a second electrical path for a second power resource to the second core of the integrated device. The substrate includes a switch coupled to the first power interconnect and the second power interconnect, where if the switch is turned on, the switch is configured to enable at least some of the power resource from the second power resource to travel to the first core of the integrated device. The sharing of power resources helps enable the integrated device to perform optimally by providing additional power to one or more cores that may need it and/or want it, if another core may not need as much power.

Figure 1:
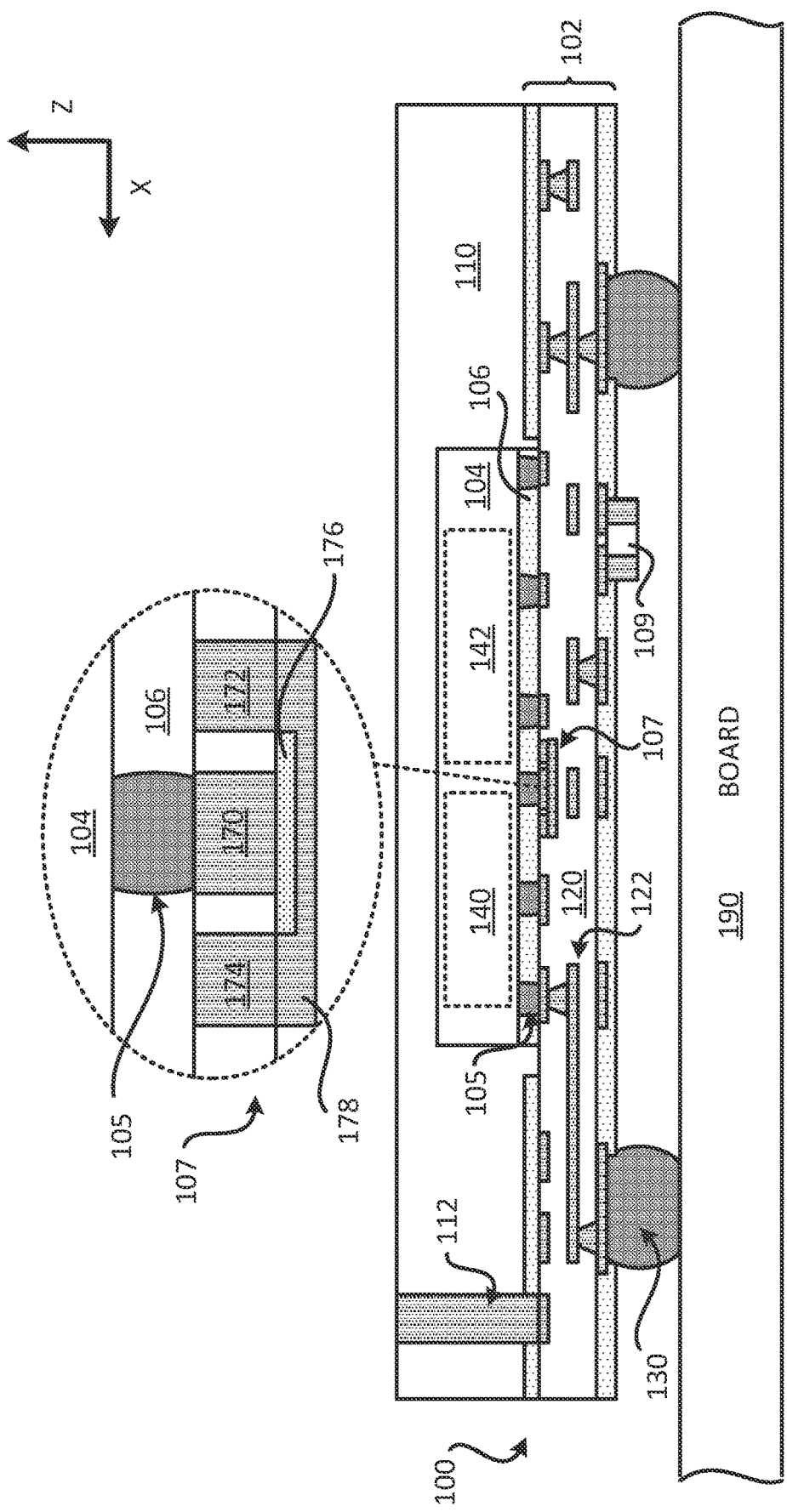
FIG. 1 illustrates a profile view of a package that includes a substrate and an integrated device with multiple cores with shareable power resources.

Exemplary Package Comprising an Integrated Device Configured for Shareable Power Resource FIG. 1 illustrates a package 100 that includes a substrate 102, an integrated device 104 and an encapsulation layer 110. As will be further described below, the integrated device 104 is configured for shared power resource. The package 100 is coupled to a board 190 through a plurality of solder interconnects 130. The integrated device 104 is coupled to the substrate 102 through a plurality of solder interconnects 105. The encapsulation layer 110 is coupled to the substrate 102. The encapsulation layer 110 is located over the substrate 102 and the integrated device 104. The encapsulation layer 110 encapsulates the integrated device 104. A passive device 109 is coupled to the substrate 102. The passive device 109 may include a capacitor. An interconnect 112 may extend through the encapsulation layer 110. The interconnect 112 may include a through mold via (TMV). The interconnect 112 may be coupled to the substrate 102.

The integrated device 104 is coupled to the substrate 102 through the plurality of solder interconnects 105. In some implementations, the integrated device 104 may be coupled to the substrate 102 through the plurality of solder interconnects 105 and pillar interconnects. An underfill 106 is located between the integrated device 104 and the substrate 102. The underfill 106 may be located around the plurality of solder interconnects 105. The integrated device 104 includes at least two cores. For example, the integrated device 104 includes a first core 140 and a second core 142. A core may be a processing unit of an integrated device, that is configured to read and execute program instructions. Each core of an integrated device may be a separate processing unit of the integrated device. In some implementations, each core may be configured to perform separate and/or different functions for the integrated device 104.

The substrate 102 includes at least one dielectric layer 120 and a plurality of interconnects 122. As will be further described below in at least FIG. 2, the plurality of interconnects 122 includes interconnects that are configured to provide electrical paths for power resource to the cores of the integrated device 104. The substrate 102 also includes at least one switch 107. The at least one switch 107 may include at least one transistor. The at least one switch 107 includes a gate interconnect 170, a source interconnect 172, a drain interconnect 174, a gate dielectric layer 176, and a channel 178. When a voltage is applied at the gate interconnect 170, a current may be induced from the source interconnect 172 to the drain interconnect 174 through the channel 178. The at least one switch 107 may be used to provide shareable power resources to the cores of the integrated device 104. The at least one switch 107 may be located in different portions of the substrate 102. In some implementations, the at least one switch 107 may be located near a top metal layer of the substrate 102 (e.g., metal layer near an integrated device coupled to the substrate 102). In some implementations, the at least one switch 107 may be located near a bottom metal layer of the substrate 102 (e.g., metal layer that is coupled to a solder interconnect (e.g., ball grid array)). In some implementations, the at least one switch 107 may be located in the substrate 102, near where the passive device 109 is coupled to the substrate 102.

The plurality of interconnects 122 may include several power interconnects (e.g., power planes) that are each configured to provide an electrical path for a power resource (e.g., power) to one or more integrated devices (e.g., core of an integrated device). For example, a first power interconnect (e.g., first power plane) may be used to provide an electrical path for power to the first core 140, and a second power interconnect (e.g., second power plane) may be used to provide an electrical path for power to the second core 142. The various power resources may be coupled to one or more power management integrated devices (e.g., power management integrated circuit (PMIC)). Thus, the various power resources may travel through one or more power management integrated devices. The various power resources may be part of a power grid resource. A power grid resource may include at least one power resource and a ground. Although not shown, the one or more power management integrated devices may be coupled to the substrate 102, the package 100, another substrate and/or the board 190. In one example, a power source (e.g., battery) may be coupled to one or more power management integrated devices. Energy (e.g., electrical current) from the power source may travel through the one or more power management integrated devices, and may get redistributed to various integrated devices and/or cores of integrated devices through a power grid resource that includes several power resource electrical paths (e.g., first power resource electrical path, second power resource electrical path, third power resource electrical path). In another example, a first power resource may be from a first power source (e.g., first battery) and a second power resource may be from a second power source (e.g., second battery).

Different implementations may use different materials for the package 100. The at least one dielectric layer 120 may include glass, polyimide, oxide and/or combinations thereof. The gate dielectric layer 176 may include $HfO_2$ (hafnium oxide), $SiO_2$ (silicon dioxide) $Al_2O_3$ (aluminum oxide) and/or combinations thereof. The channel 178 may include polycrystalline SiGe (silicon germanium), CdSe (Cadmium selenide), IgZo (indium gallium zinc oxide), tungsten (W)-Doped $In_2O_3$ (indium oxide) and/or combinations thereof. The gate interconnect 170, a source interconnect 172, a drain interconnect 174 may include copper, cobalt, tungsten (W) and/or combinations thereof.

Packages for high performance devices need to have redundancy and a high grade of robustness built into the packages. From a design perspective, power interconnects (e.g., power planes) in substrates of a package need to be separated to optimize the power consumption of the integrated devices of a package. However, separating power planes of a package weakens the power distribution network (PDN). This can result in sub allocation of power resources for different integrated devices and/or portions of an integrated devices. The end result is that integrated devices are not able to perform optimally. To help provide optimal integrated device performances in packages, switches may be implemented in substrates to allow the sharing of power resources.

Figure 2:
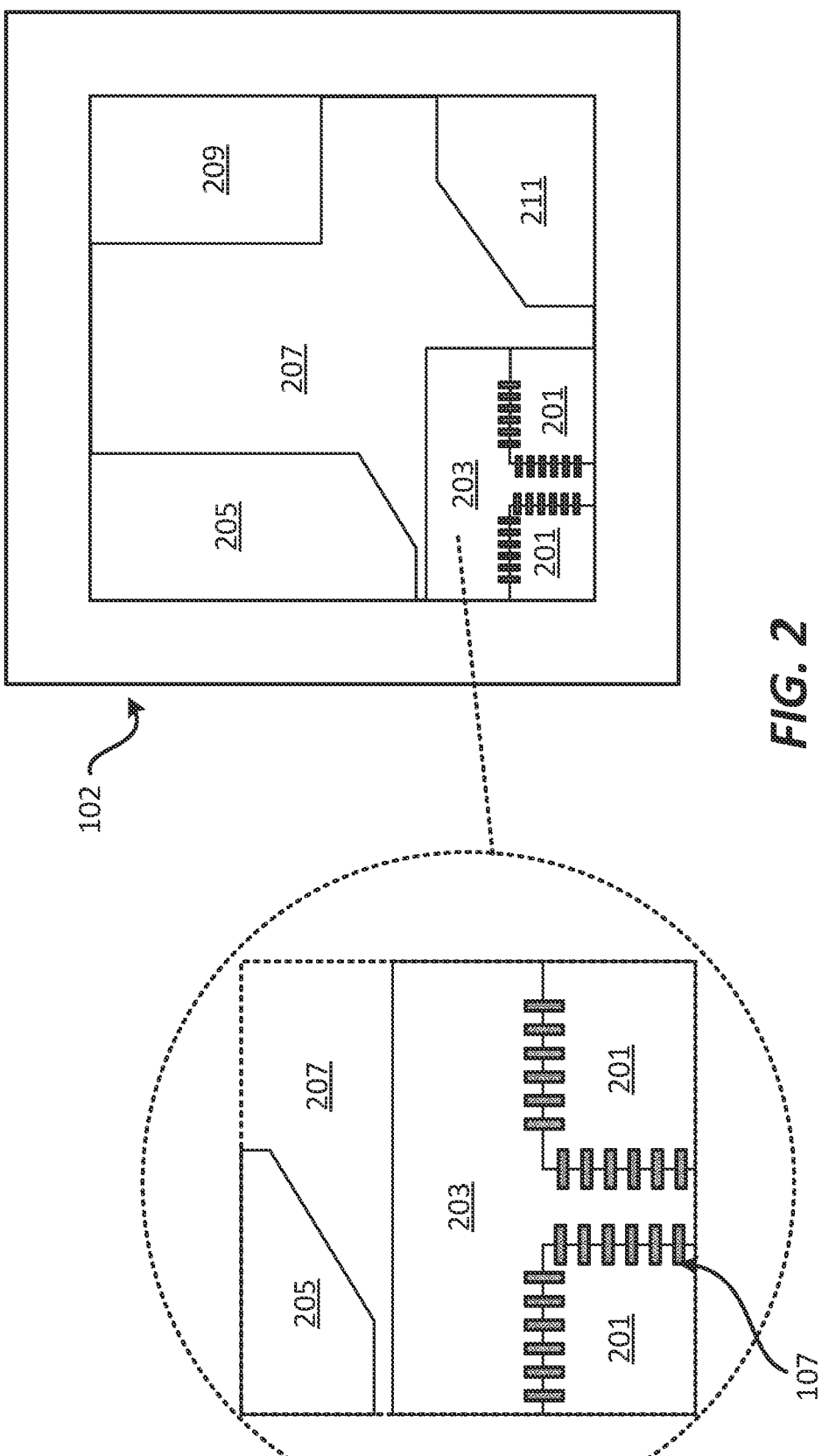
FIG. 2 illustrates a plan view of an exemplary substrate with various power planes configured for shareable power resources.

FIG. 2 illustrates a plan view of metal layer of the substrate 102. The substrate 102 includes a first power plane 201, a second power plane 203, a third power plane 205, a fourth power plane 207, a fifth power plane 209 and a sixth power plane 211. The first power plane 201, the second power plane 203, the third power plane 205, the fourth power plane 207, the fifth power plane 209 and the sixth power plane 211 are examples of interconnects. Each of the power plane is configured to provide an electrical path for an integrated device (e.g., core of an integrated device). For example, the first power plane 201 may be configured to be coupled to the first core 140 of the integrated device 104, and the second power plane 203 may be configured to be coupled to the second core 142 of the integrated device 104. Each particular power plane is configured to be electrically coupled to a particular power resource. A power plane may be located on any metal layer of the substrate 102. In some implementations, a power plane may be located on a metal layer of the substrate 102 that is closest to the integrated device 104. Each of the power planes may be configured to be electrically coupled to one or more power management integrated devices. Thus, each of the power planes may be configured to as an electrical path for a particular electrical current through one or more power management integrated devices.

FIG. 2 illustrates the substrate 102 that includes a plurality of switches 107. The plurality of switches 107 is coupled to the first power plane 201 and the second power plane 203. The plurality of switches 107 is configured to allow a current traveling through the second power plane 203 to be shared with the first power plane 201. When/if a switch is off, then a current may not flow through that particular switch. When/if a switch is on, then a current may flow through that particular switch. The more switches that are turned on, the more current may flow from the second power plane 203 to the first power plane 201. Thus, the amount of power that is shared may be controlled by controlling the number of switches from the plurality of switches 107 that are turned on. If all the switches are off, then there is no sharing from the second power plane 203 to the first power plane 201. FIG. 2 illustrates switches are coupled to the first power plane 201 (e.g., first interconnect) and the second power plane 203 (e.g., 203). However, the switches may be coupled between any of the different power planes illustrated and described in the disclosure. Moreover, the substrate 102 may include power rails and switches may be coupled between power planes and/or power rails. The plurality of interconnects 122 may include the power planes (e.g., 201, 203, 205, 207, 209, 211) and/or the power rails.

FIG. 3 illustrates exemplary electrical paths in the package 100 with the switch 107 turned off. As shown in FIG. 3, an electrical path 301 is coupled to the core 140 of the integrated device 104, and an electrical path 303 is coupled to the core 142 of the integrated device 104. The electrical path 301 (e.g., first electrical path) includes a first solder interconnect from the plurality of solder interconnects 130, a first plurality of interconnects from the plurality of interconnects 122 (which includes the first power plane 201 (e.g., first power interconnect)), a first solder interconnect from the plurality of solder interconnects 105 and the first core 140. The electrical path 303 (e.g., second electrical path) includes a second solder interconnect from the plurality of solder interconnects 130, a second plurality of interconnects from the plurality of interconnects 122 (which includes the second power plane 203 (e.g., second power interconnect)), a second solder interconnect from the plurality of solder interconnects 105 and the second core 140. The electrical path 303 may also include the passive device 109.

FIG. 4 illustrates exemplary electrical paths in the package 100 with the switch 107 turned on. The switch 107 may be part of the electrical path 303. The switch 107 may be coupled to the plurality of interconnects 122. The switch 107 may be coupled to the integrated device 104 (e.g., configured to be electrically coupled to the core 140 of the integrated device). When/if the switch 107 is turned on, some power from the second power resource travelling through the electrical path 303 is shared and diverted to the first core 140 through the switch 107. Some power from the second power resource may travel through the second power plane 203 and the first power plane 201. The switch 107 is controllable by the integrated device 104 (e.g., controllable by the first core 140 and/or the second core 142). Thus, the switch 107 may be turned on and off by the integrated device 104. More power may be shared with the first power plane 201 and the first core 140 by turning on additional switches, which provides additional electrical paths for power to travel to the first core 140.

Figure 5:
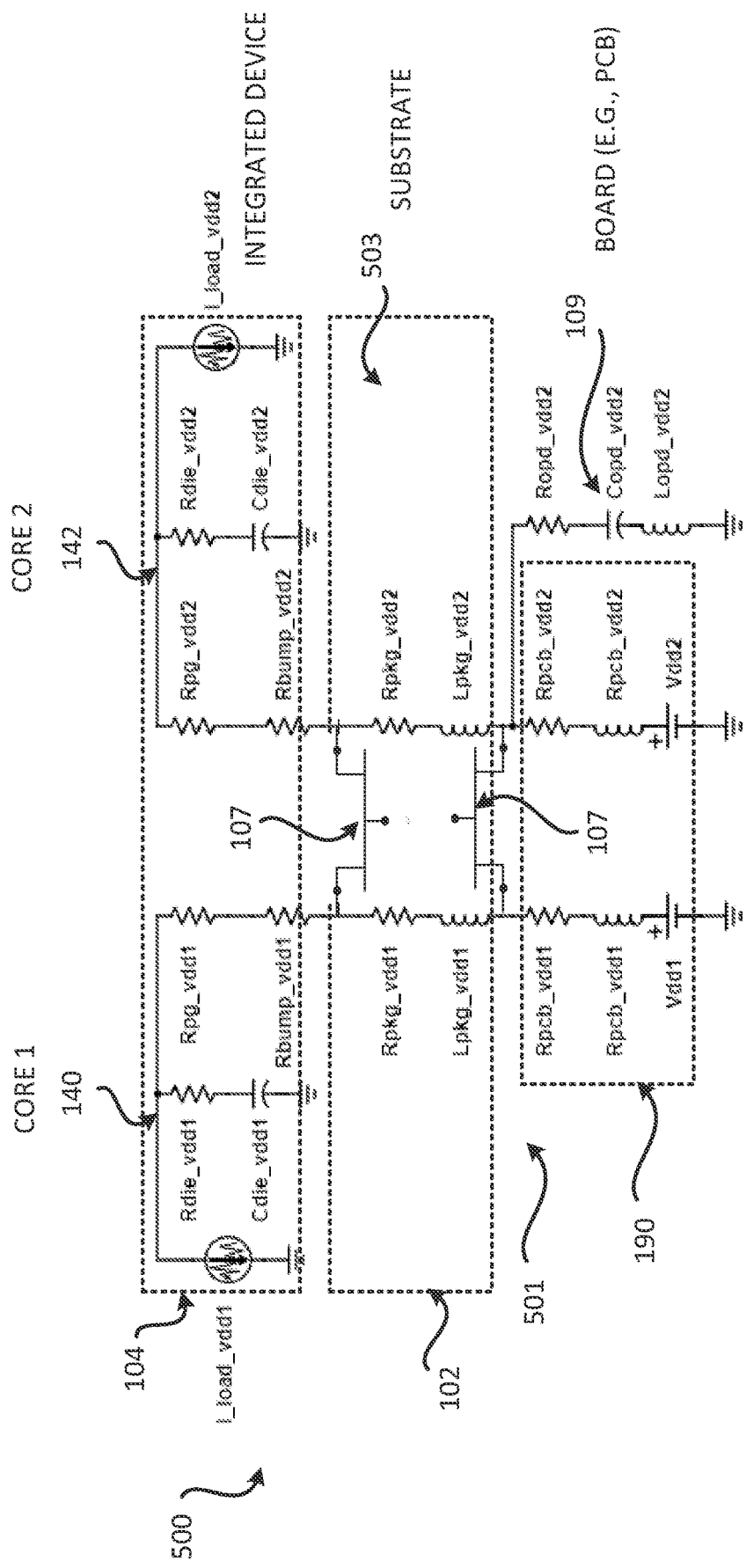
FIG. 5 illustrates an electrical circuit diagram of a package that includes a substrate and an integrated device with multiple cores with shareable power resources.

FIG. 5 illustrates an electrical circuit diagram 500 for the package 100. The electrical circuit diagram 500 includes a first circuit 501 and a second circuit 503. The first circuit 501 may be an electrical representation of the electrical path 301. The second circuit 503 may be an electrical representation of the electrical path 303. The first circuit 501 is configured to be electrically coupled to the second circuit 503 through at least one switch 107. The first circuit 501 may include first interconnects from the board 190, a first power plane 201 and the first core 140. The second circuit 503 may include second interconnects from the board 190, a second power plane 203, the passive device 109, and the second core 142. The at least one switch 107 is part of the second circuit 503, which is located in the substrate 102. The at least one switch 107 may be located near the solder interconnects 130 (e.g., ball grid array). The at least one switch 107 may part of the substrate 102 where the passive device 109 is coupled to the substrate 102.

Figure 6:
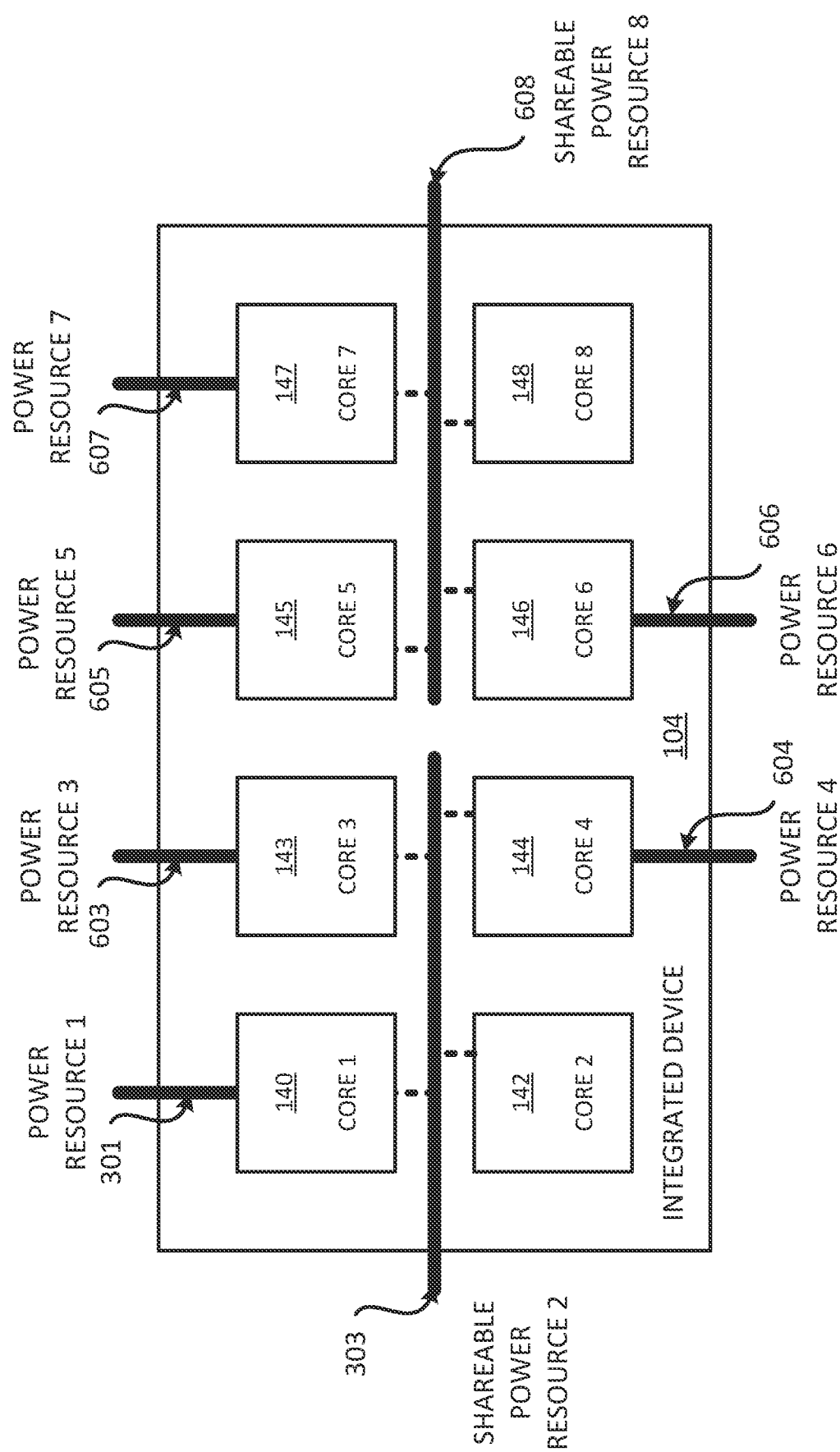
FIG. 6 illustrates an exemplary integrated device with multiple cores that have shareable power resources.

FIG. 6 illustrates an example of the integrated device 104 that includes the first core 140, the second core 142, a third core 143, a fourth core 144, a fifth core 145, a sixth core 146, a seventh core 147 and an eighth core 148. The first core 140 is coupled to the first electrical path 301, which is coupled to a first power resource. The second core 142 is coupled to the second electrical path 303, which is coupled to a second power resource. The second power resource is a shareable power resource. The third core 143 is coupled to the third electrical path 603, which is coupled to a third power resource. The fourth core 144 is coupled to the fourth electrical path 604, which is coupled to a fourth power resource. The second power resource is shareable with the first core 140, the third core 143 and/or the fourth core 144. Several switches (e.g., 107) may be used to allow the second power resource to be shareable with the first core 140, the third core 143 and/or the fourth core 144.

The fifth core 145 is coupled to the fifth electrical path 605, which is coupled to a fifth power resource. The sixth core 146 is coupled to the sixth electrical path 606, which is coupled to a sixth power resource. The seventh core 147 is coupled to the seventh electrical path 607, which is coupled to a seventh power resource. The eighth core 148 is coupled to the eighth electrical path 608, which is coupled to an eighth power resource. The eighth power resource is a shareable power resource. The eighth power resource is shareable with the fifth core 145, the sixth core 146 and/or the seventh core 147. Several switches (e.g., 107) may be used to allow the eighth power resource to be shareable with the fifth core 145, the sixth core 146 and/or the seventh core 147.

Different implementations may have different numbers of cores with different configurations and designs for the power resources. Any of the cores (e.g., processing cores) may be replaced with a memory (e.g., memory unit). The use of sharing power resources may be applicable between memory and/or cores of an integrated device. (e.g., between two memories, between memory and core of an integrated devices). The use of shareable power resources may be applicable between integrated devices of a package. For example, a power resource that is allocated to be used by a first integrated device may be shared with a second integrated device. The integrated device (e.g., 104, 740, 742) may include a die (e.g., semiconductor bare die). The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104, 740, 742) may include at least one electronic circuit (e.g., first electronic circuit, second electronic circuit, etc. . . . ).

Figure 7:
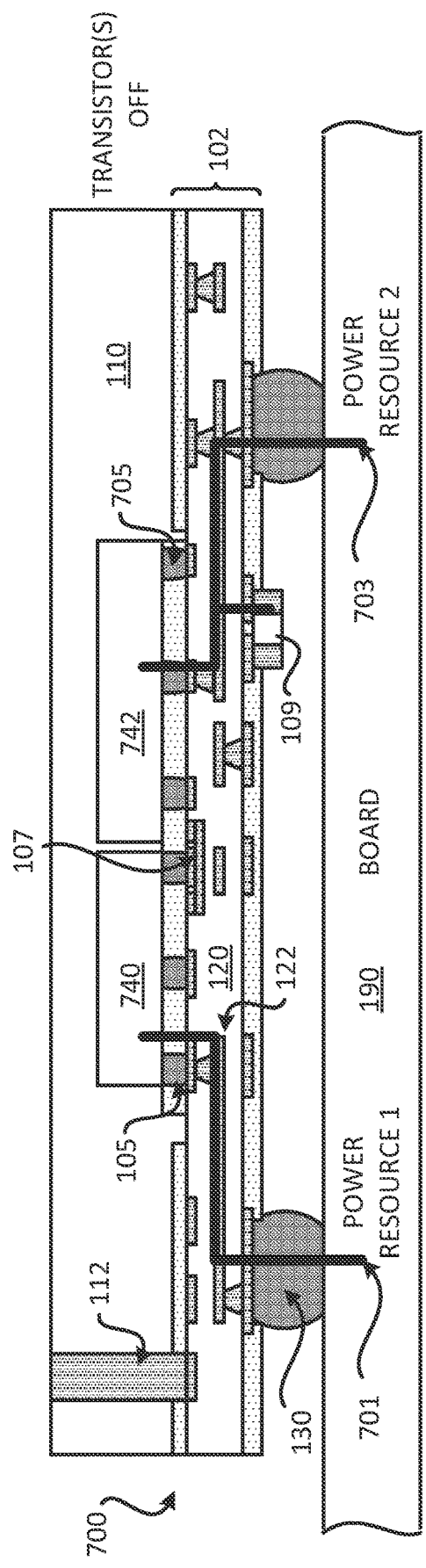
FIG. 7 illustrates an exemplary package with possible electrical paths for a substrate and integrated devices with shareable power resources.
Figure 8:
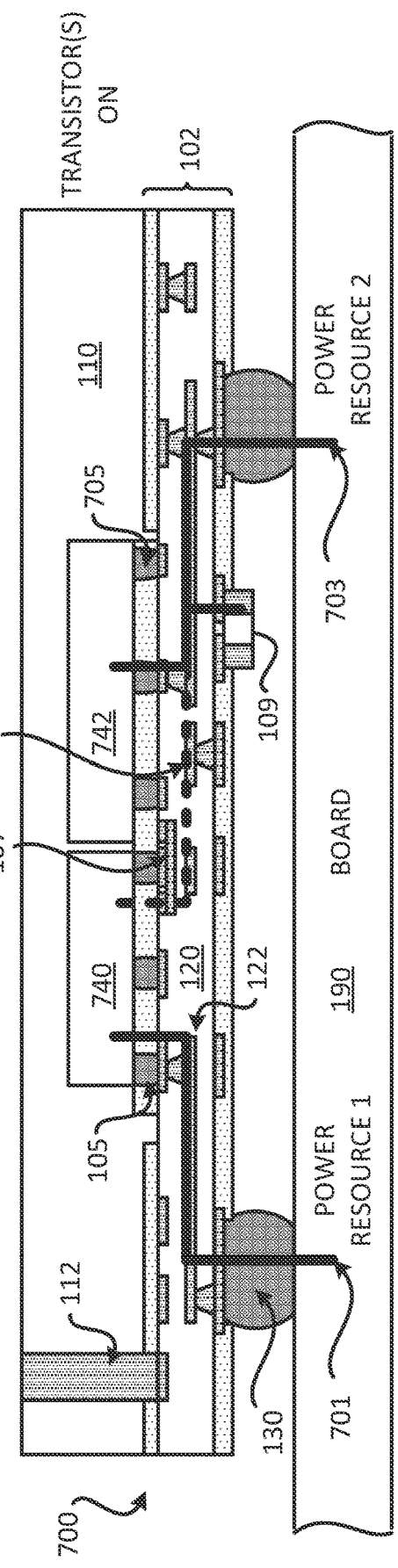
FIG. 8 illustrates an exemplary package with possible electrical paths for a substrate and integrated devices with shareable power resources.

Exemplary Package Comprising an Integrated Devices Configured for Shareable Power Resource FIGS. 7 and 8 illustrate a package 700 that includes a first integrated device 740 and a second integrated device 742. The package 700 is similar to the package 100 of FIG. 1 and FIGS. 3-4, and thus may include the same components and/or similar components, as the package 100. The first integrated device 740 may include at least one core. The second integrated device 742 may include at least one core. The first integrated device 740 and the second integrated device 742 are coupled to the substrate 102. The first integrated device 740 is coupled to the substrate 102 through the plurality of solder interconnects 105. In some implementations, the first integrated device 740 may be coupled to the substrate 102 through the plurality of solder interconnects 105 and pillar interconnects. The second integrated device 742 is coupled to the substrate 102 through the plurality of solder interconnects 705. In some implementations, the second integrated device 742 may be coupled to the substrate 102 through the plurality of solder interconnects 705 and pillar interconnects.

FIG. 7 illustrates exemplary electrical paths in the package 700 with the switch 107 turned off. As shown in FIG. 7, an electrical path 701 is coupled to the first integrated device 740, and an electrical path 703 is coupled to the second integrated device 742. The electrical path 701 (e.g., first electrical path) includes a first solder interconnect from the plurality of solder interconnects 130, a first plurality of interconnects from the plurality of interconnects 122 (which includes the first power plane 201 (e.g., first power interconnect)), a first solder interconnect from the plurality of solder interconnects 105 and the first integrated device 740. The electrical path 703 (e.g., second electrical path) includes a second solder interconnect from the plurality of solder interconnects 130, a second plurality of interconnects from the plurality of interconnects 122 (which includes the second power plane 203 (e.g., second power interconnect)), a second solder interconnect from the plurality of solder interconnects 705 and the second integrated device 742. The electrical path 703 may also include the passive device 109.

FIG. 8 illustrates exemplary electrical paths in the package 700 with the switch 107 turned on. The switch 107 may be part of the electrical path 703. The switch 107 may be coupled to the plurality of interconnects 122. The switch 107 may be coupled to the integrated device 740 (e.g., configured to be electrically coupled to the integrated device 740 of the integrated device). When/if the switch 107 is turned on, some power from the second power resource travelling through the electrical path 703 is shared and diverted to the first integrated device 740 through the switch 107. Some power from the second power resource may travel through the second power plane 203 and the first power plane 201. The switch 107 is controllable by the first integrated device 740 and/or the second integrated device 742. Thus, the switch 107 may be turned on and off by the first integrated device 740 and/or the second integrated device 742. More power may be shared with the first power plane 201 and the first integrated device 740 by turning on additional switches, which provides additional electrical paths for power to travel to the first core 140.

Exemplary Flow Diagram of a Method for Sharing Power Resources

Figure 9:
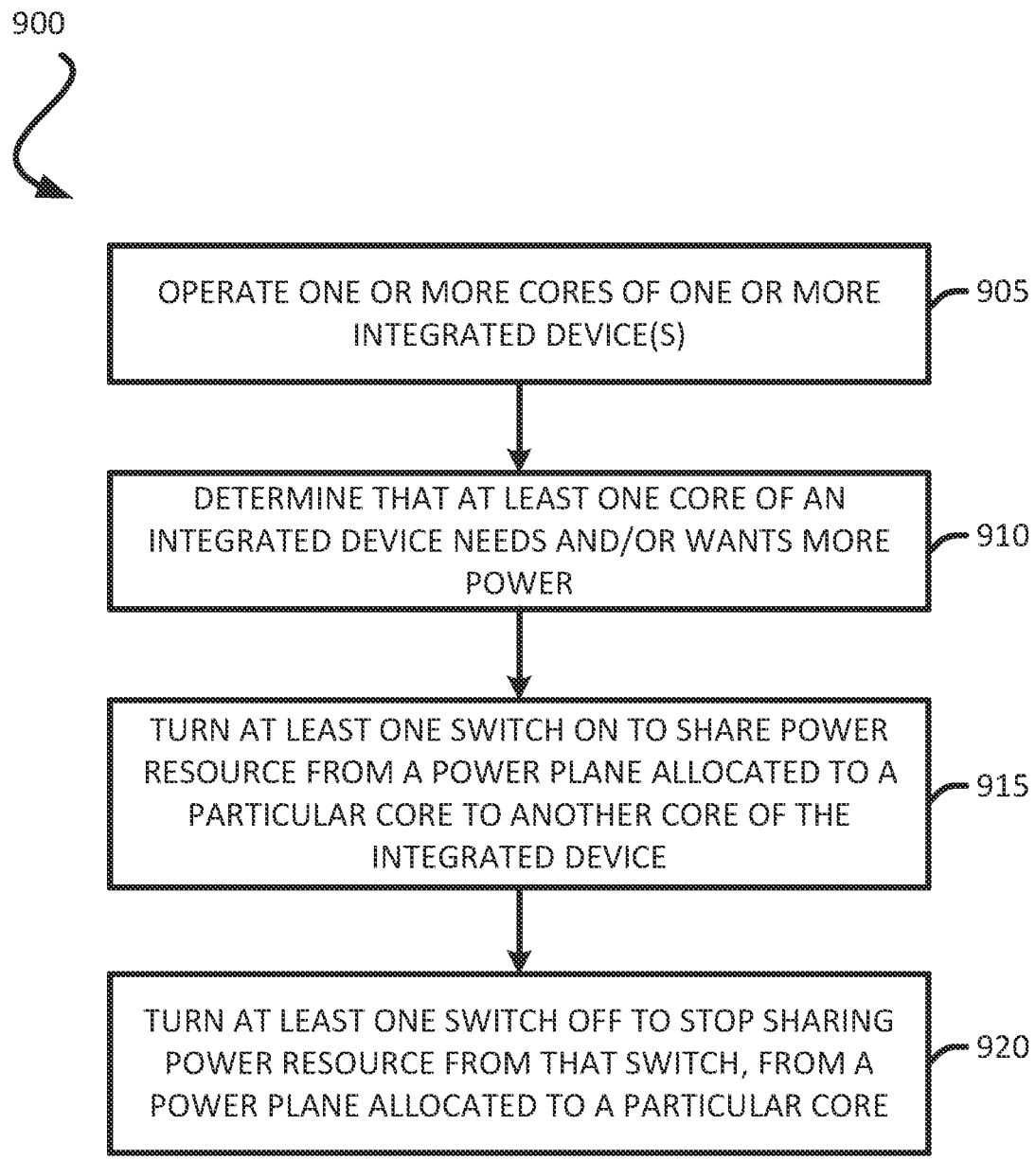
FIG. 9 illustrates an exemplary flow diagram of a method for providing shareable power resources for a package that includes multiple cores.

FIG. 9 illustrates an exemplary flow diagram of a method 900 for sharing power resources in a package. The method 900 may be implemented by one or more integrated devices. The method 900 may be implemented by one or more cores of an integrated devices. For example, the method 900 may be implemented by the integrated device 104 of the package 100. In another example, the method 900 may be implemented by the integrated devices 740 and/or 742 of the package 700.

The method operates (at 905) one or more cores (e.g., 140, 142) of an integrated device (e.g., 104). Operating one or more cores includes reading and executing instructions. Each core may perform separate and/or different functions. In some implementations, the cores may be part of separate integrated devices. Operating one or more cores may also include utilizing one or more memory.

The method determines (at 910) that at least one core of an integrated device needs and/pr wants more power. Different implementations may have different criteria/criterion for determining whether one or more core needs and/or wants more power. For example, when the amount of power that is provided to a core is less than the maximum allowable power, the method may determine that the core needs and/or wants more power. Whether a core needs more power may mean whether a core wants more power and/or may benefit from more power. For example, a core may need and/or want more power when the core is operating at a lower frequency than the maximum frequency. In some implementations, more than one core may need and/or want more power. In addition to determining that a core may want and/or need more power, the method 900 may also determine whether there is available shareable power that is allocated for another core. It is noted that not all power that is allocated to a core is shareable to another core. In some implementations, power allocated to a particular core is shareable with another core, when the particular core is operating at less than maximum capacity and/or the particular core is not being utilized. Thus, even if one or more core may need and/or want more power, there may not be power to share from a power resource allocated to another core.

The method turns on (at 915) at least one switch to share power resource allocated to a particular core to another core of the integrated device. The switch may include a transistor.

In some implementations, turning on a switch may include applying a voltage to a gate interconnect of a transistor. In some implementations, the more switches that are turned on the more power is shared with another core of the integrated devices. In some implementations, the number of switches that is turned on may vary in real time. That is, the number of switches that are turned on may be different during different times of the operations of one or more cores of the integrated devices. It is noted that none of the switches may be turned on when there is no available power to share. As mentioned above, in some implementations, even if a core needs and/or wants more power, the method may determine that no additional power is available to be shared from another core. In such instance, the method may not turn on a switch and/or any additional switches. As an example, the method may turn on a first switch and a second switch. The first switch and the second switch are coupled to a first power interconnect and a second power interconnect of a substrate. The first power interconnect may be coupled to a first core and the second power interconnect may be coupled to a second core. Turning on the first switch and the second switch may result in some of the second power resource to travel from the second power interconnect to the first power interconnect through the first switch and the second switch. Thus, some power from a second power resource that is allocated to the second core may be redirected to the first core through the first switch and the second switch. In some implementations, turning on at least one switch includes turning on some switch and/or all switches between two different power interconnects (e.g., power planes).

The method may turn off (at 920) at least one switch to stop sharing power resources and/or reduce the sharing of power resources. The switch may include a transistor. In some implementations, turning off a switch may include stopping a voltage from being applied to a gate interconnect of a transistor. Turning off a particular switch may mean that power may not flow through that particular switch. However, power may still flow between different power interconnects through another switch that is still turned on. In some implementations, the method 900 may continually and iteratively check in real time the power requirements of integrated devices and/or cores of integrated devices, and turn on and off one or more switches to provide power resources as needed to the various integrated devices and/or the various cores of integrated devices. The criteria/criterion for determining whether or not an integrated device (e.g., core of an integrated device) needs and/or wants additional power may vary with different implementations. Examples of what may be used to determine whether more power is needed for an integrated device is the strength of the voltage, the strength of the current of the power that is provided to the integrated devices, and/or the operating frequency of the core(s).

For example, the method 900 may operate an integrated device that includes a first core and a second core, where a first power resource is directed to the first core and a second power resource is directed to the second core. The method 900 may determine that the first core of the integrated device needs and/or wants more power. The method 900 may turn on at least one switch to reroute some of the second power resource to the first core of the integrated device (when there is available power from the second power resource). In some implementations, turning on at least one switch includes turning on some but not all of the switches coupled between a first power interconnect coupled to the first core and a second power interconnect coupled to the second core. The method 900 may further determine that the first core of the integrated device does not need more power (e.g., does not need all the power than is provided by the first power resource and some power from the second power resource). The method 900 may turn off the at least one switch to stop the rerouting of some of the second power resource to the first core of the integrated device. The method 900 may further determine that the first core of the integrated device needs further power (e.g., needs further power than what is already provided by the first power resource and some power from the second power resource). The method 900 may turn on more or all of the switches coupled between the first power interconnect coupled to the first core and the second power interconnect coupled to the second core, to reroute more of the second power resource to the first core of the integrated device.

The method 900 may be applicable to cores of the same integrated device, cores of different integrated devices and/or different integrated devices. The method 900 may also be applicable to memories of an integrated devices (e.g., between two memories, between a memory and a core of an integrated device). Thus, one or more core as described above in FIG. 9 may be applicable to one memory. The method 900 may be applicable to two or more integrated devices.

For example, the method 900 may operate a first integrated device and a second integrated device, where a first power resource is directed to the first integrated device and a second power resource is directed to the second integrated device. The method 900 may determine that the first integrated device needs and/or wants more power. The method 900 may turn on at least one switch to reroute some of the second power resource to the first integrated device. In some implementations, turning on at least one switch includes turning on some but not all of the switches coupled between a first power interconnect coupled to the first integrated device and a second power interconnect coupled to the second integrated device. The method 900 may further determine that the first integrated device does not need more power (e.g., does not need all the power than is provided by the first power resource and some power from the second power resource). The method 900 may turn off the at least one switch to stop the rerouting of some of the second power resource to the first integrated device. The method 900 may further determine that the first integrated device needs further power (e.g., needs further power than what is already provided by the first power resource and some power from the second power resource). The method 900 may turn on more or all of the switches coupled between the first power interconnect coupled to the first integrated device and the second power interconnect coupled to the second integrated device, to reroute more of the second power resource to the first integrated device.

Exemplary Sequence for Fabricating a Substrate Comprising a Switch

Figure 10A:
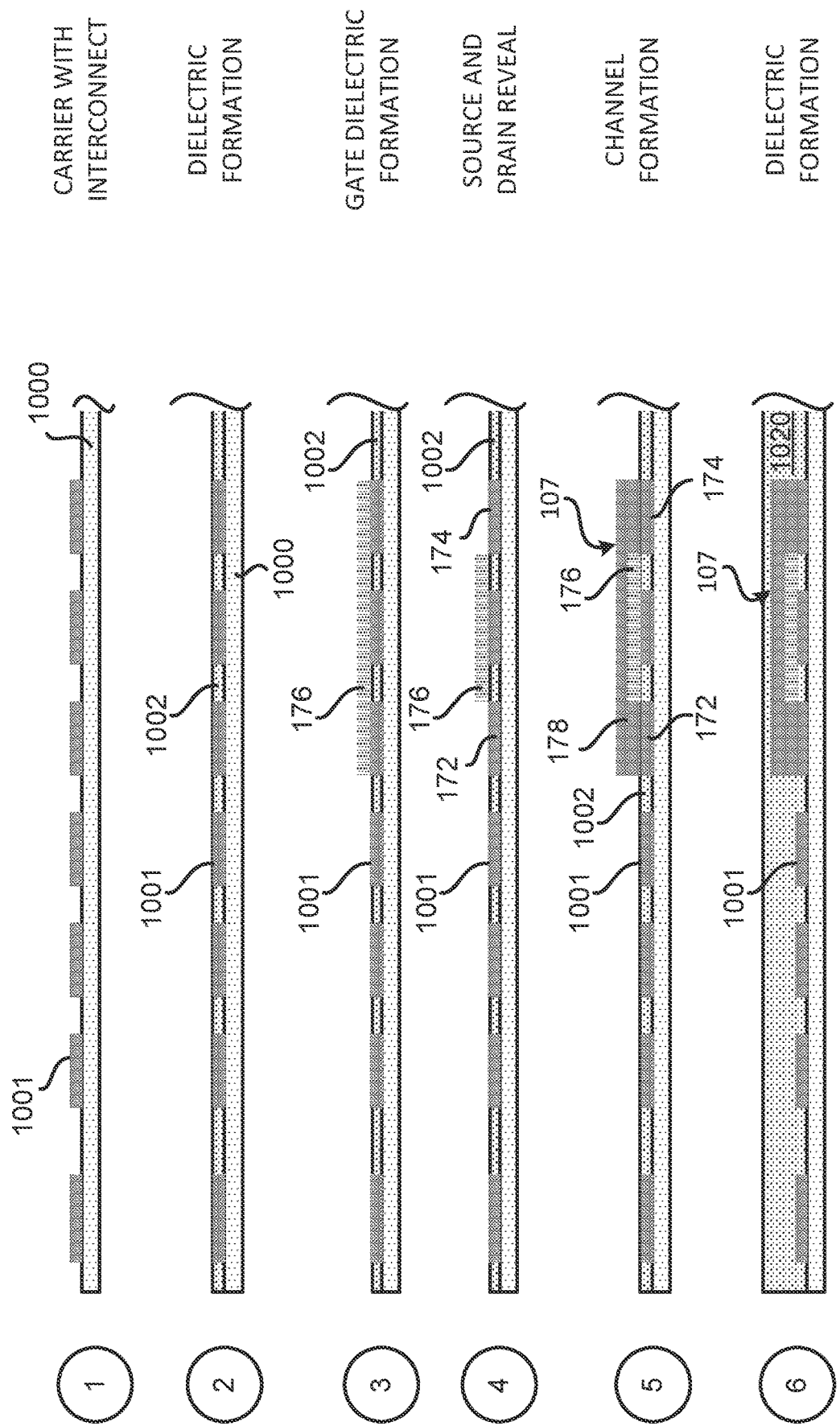
FIGS. 10A-10C illustrate an exemplary sequence for fabricating a substrate that includes at least one switch for controlling shareable power resources.
Figure 10B:
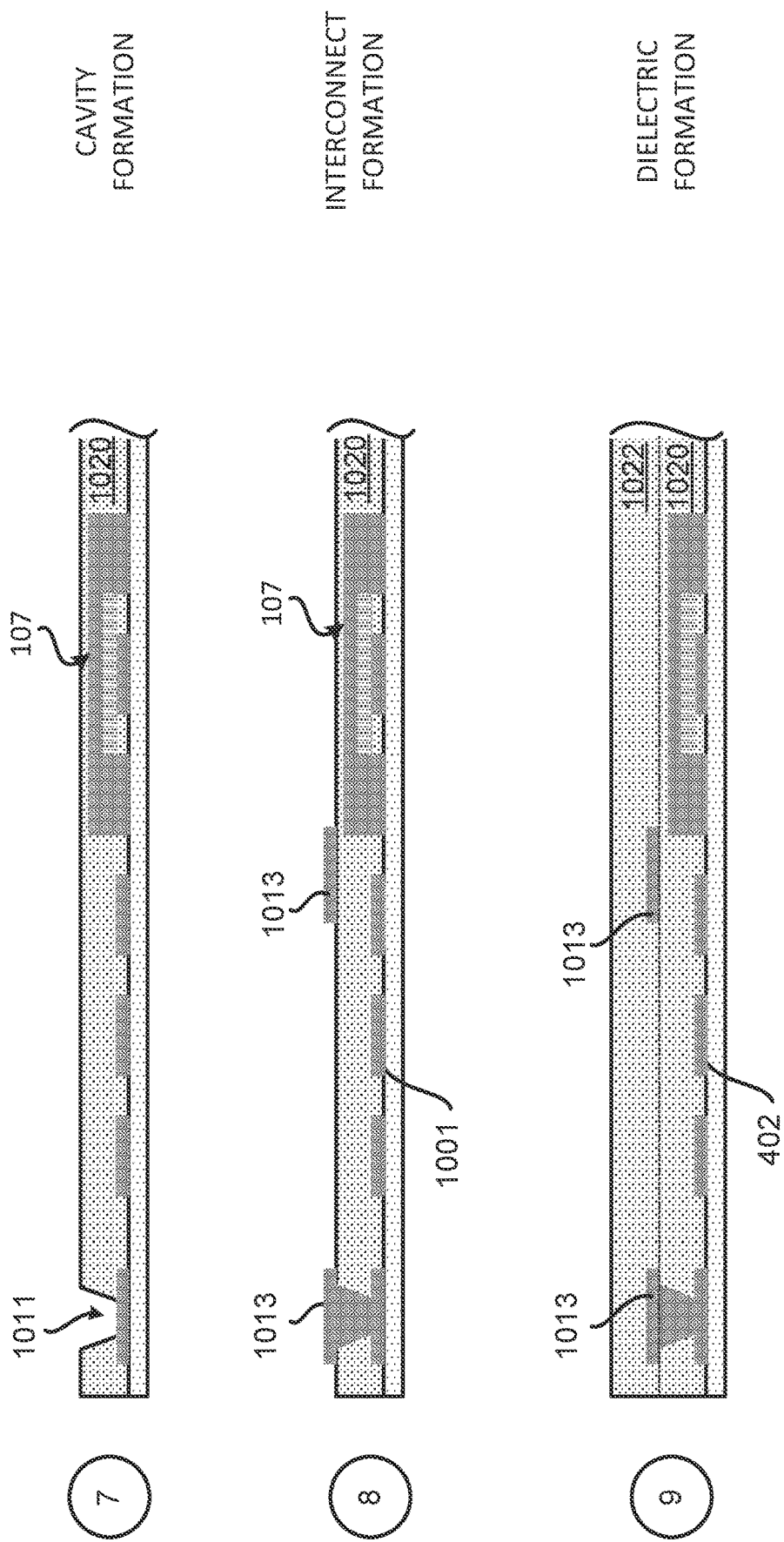
Figure 10C:
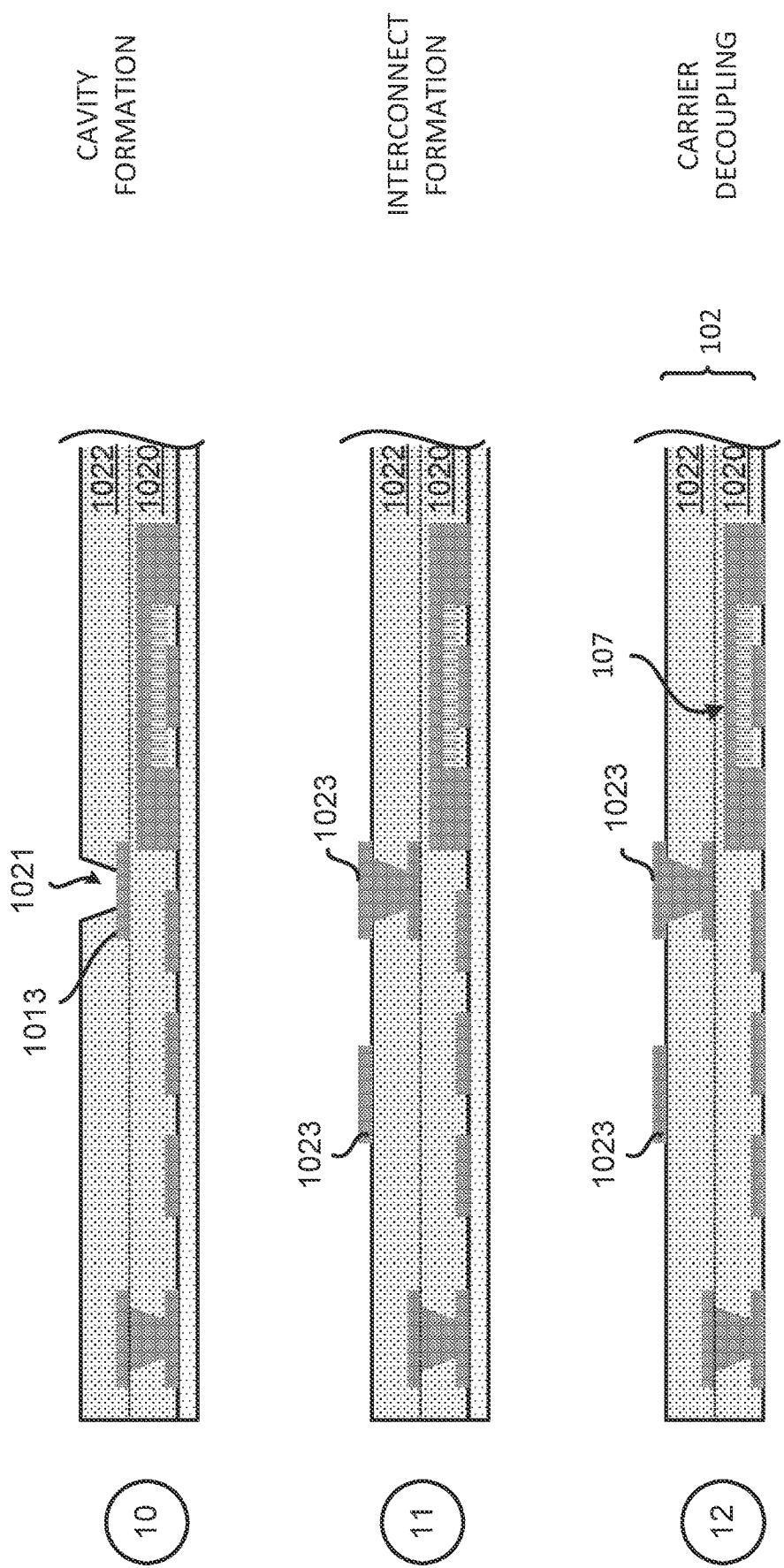

In some implementations, fabricating a substrate includes several processes. FIGS. 10A-10C illustrate an exemplary sequence for providing or fabricating a substrate that includes a switch for sharing power resources. In some implementations, the sequence of FIGS. 10A-10C may be used to provide or fabricate the substrate 102 that includes at least one switch.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 10A, illustrates a state after a carrier 1000 is provided and a metal layer is formed over the carrier 1000. The metal layer may be patterned to form interconnects 1001. A plating process may be used to form the metal layer and interconnects. Some of the interconnects 1001 may define a gate interconnect 170, a source interconnect 172 and/or a drain interconnect 174.

Stage 2 illustrates a state after a dielectric layer 1002 is formed over the carrier 1000 and the interconnects. The dielectric layer 1002 may include polyimide. A deposition process may be used to form the dielectric layer 1002.

Stage 3 illustrates a state after a gate dielectric layer 176 is formed over the interconnect 1001. A deposition process may be used to form the gate dielectric layer 176. Different implementations may use different materials for the gate dielectric layer 176. For example, the gate dielectric layer 176 may include $HfO_2$ (hafnium oxide), $SiO_2$ (silicon dioxide) $Al_2O_3$ (aluminum oxide) and/or combinations thereof.

Stage 4 illustrates a state after portions of the gate dielectric layer 176 are removed. Removing portions of the gate dielectric layer 176 may reveal the source interconnect 172 and the drain interconnect 174. The source interconnect 172 and the drain interconnect 174 may be formed from portions of the interconnects 1001.

Stage 5 illustrates a state after a channel 178 is formed over the gate dielectric layer 176, the source interconnect 172 and the drain interconnect 174. Different implementations may use different materials for the channel 178. The channel 178 may include polycrystalline SiGe (silicon germanium), CdSe (Cadmium selenide), IgZo (indium gallium zinc oxide), tungsten (W)-Doped $In_2O_3$ (indium oxide) and/or combinations thereof. The materials that are used for the channel 178 may be formed using low temperatures (e.g., less than 200 Celsius). Stage 5 may illustrate a switch 107 that includes a gate interconnect 170, a source interconnect 172, a drain interconnect 174, a gate dielectric layer 176 and a channel 178. The switch 107 may be configured as a transistor.

Stage 6 illustrates a state after a dielectric layer 1020 is formed over the carrier 1000, the switch 107 and the interconnects 1001. The dielectric layer 1020 may include polyimide. However, different implementations may use different materials for the dielectric layer 1020. The dielectric layer 1020 may include the dielectric layer 1002. A deposition process may be used to form the dielectric layer 1020.

Stage 7, as shown in FIG. 10B, illustrates a state after a plurality of cavities 1011 is formed in the dielectric layer 1020. The plurality of cavities 1011 may be formed using an etching process or laser process.

Stage 8 illustrates a state after interconnects 1013 are formed in and over the dielectric layer 1020. For example, a via, pad and/or traces may be formed. A plating process may be used to form the interconnects.

Stage 9 illustrates a state after another dielectric layer 1022 is formed over the dielectric layer 1020. A deposition process may be used to form the dielectric layer 1022.

Stage 10, as shown in FIG. 10C, illustrates a state after a cavity 1021 is formed in the dielectric layer 1022. An etching process or laser process may be used to form the cavities 1021.

Stage 11 illustrates a state after interconnects 1023 are formed in and over the dielectric layer 1022. For example, via, pad and/or trace may be formed. A plating process may be used to form the interconnects.

Stage 12 illustrates after the carrier 1000 is decoupled (e.g., removed, grinded out) from the dielectric layer 1020, leaving the substrate 102 (e.g., coreless substrate). In some implementation, the coreless substrate is an embedded trace substrate (ETS). Stage 11 illustrates the substrate 102 that includes the dielectric layer 1020, the dielectric layer 1022. In some implementations, the dielectric layer 1020 and the dielectric layer 1022 may be considered as one dielectric layer (e.g., single dielectric layer). The substrate 102 includes the plurality of interconnects 1001, the plurality of interconnects 1013, and the plurality of interconnects 1023. The plurality of interconnects 1001, the plurality of interconnects 1013, and the plurality of interconnects 1023 may be represented by the plurality of interconnects 122. Some of the interconnects from the substrate 102 may be configured as power interconnects (e.g., power planes) as described in the disclosure.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate with a Switch

Figure 11:
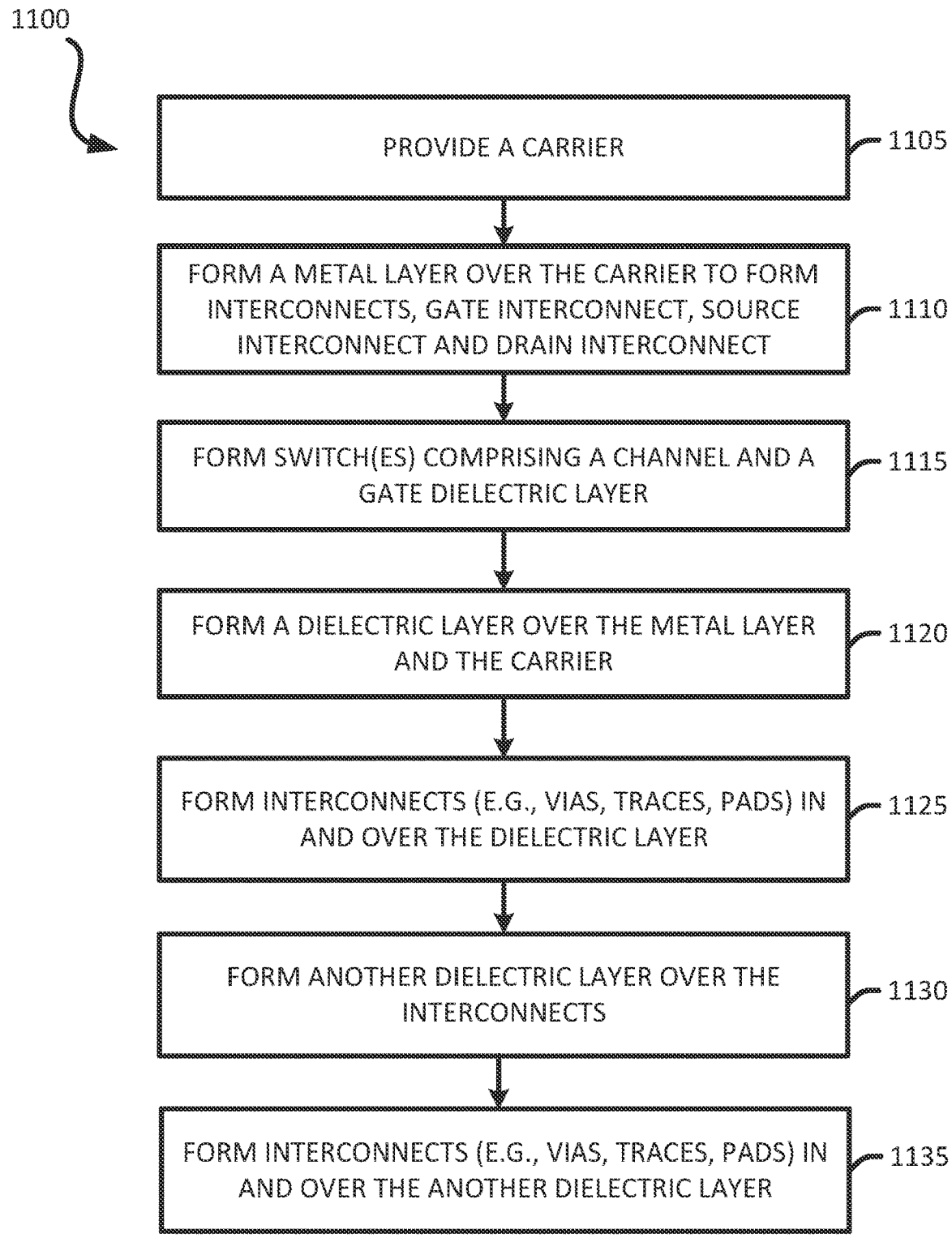
FIG. 11 illustrates an exemplary flow diagram of a method for fabricating a substrate that includes at least one switch for controlling shareable power resources.

FIG. 11 illustrates an exemplary flow diagram of a method 1100 for providing or fabricating a substrate with a switch. In some implementations, the method 1100 of FIG. 11 may be used to provide or fabricate the substrate of FIG. 1. For example, the method of FIG. 11 may be used to fabricate the substrate 102.

It should be noted that the sequence of FIG. 11 may combine one or more processes in order to simplify and/or clarify the method for providing or fabricating a substrate. In some implementations, the order of the processes may be changed or modified.

The method provides (at 1105) a carrier 1000. The method forms (at 1110) a metal layer over the carrier 1000. The metal layer may be patterned to form interconnects 1001. Some of the interconnects 1001 may define a gate interconnect 170, a source interconnect 172 and/or a drain interconnect 174. A plating process may be used to form the metal layer and interconnects. A dielectric layer may be formed after the interconnects 1001 are formed. Stage 1 of FIG. 10A illustrates and describes an example of providing a carrier and forming interconnects.

The method forms (at 1115) at least one switch 107 that includes a gate dielectric layer 176 and a channel 178. One or more deposition process may be used to form the gate dielectric layer 176 and the channel 178. The gate dielectric layer 176 may include $HfO_2$ (hafnium oxide), $SiO_2$ (silicon dioxide) $Al_2O_3$ (aluminum oxide) and/or combinations thereof. The channel 178 may include polycrystalline SiGe (silicon germanium), CdSe (Cadmium selenide), IgZo (indium gallium zinc oxide), tungsten (W)-Doped $In_2O_3$ (indium oxide) and/or combinations thereof. In some implementations, the source interconnect 172 and/or the drain interconnect 174 may be doped. The switch may include a transistor. Stages 3-5 of FIG. 10A illustrate and describe an example of forming a channel and a gate dielectric layer.

The method forms (at 1120) a dielectric layer 1020 over the carrier 1000, the interconnects 1001 and the switch 107. The dielectric layer 1020 may include polyimide. Forming the dielectric layer may also include forming a plurality of cavities (e.g., 1011) in the dielectric layer 1020. The plurality of cavities may be formed using an etching process or laser process. Stage 56 of FIG. 10A and stage 7 of FIG. 10B illustrates and describes an example of forming a dielectric layer and cavities.

The method forms (at 1125) interconnects in and over the dielectric layer. For example, the interconnects 1113 may formed. A plating process may be used to form the interconnects. Forming interconnects may include providing a patterned metal layer over and/or in the dielectric layer. Stage 8 of FIG. 10B illustrates and describes an example of forming an interconnect.

The method forms (at 1130) a dielectric layer 1022 over the dielectric layer 1020 and the interconnects 1113. The dielectric layer 1022 may include polyimide. Forming the dielectric layer may also include forming a plurality of cavities (e.g., 1021) in the dielectric layer 1022. The plurality of cavities may be formed using an etching process or laser process. Stage 9 of FIG. 10B and stage 10 of FIG. 10C illustrate and describe examples of forming a dielectric layer and a cavity.

The method forms (at 1135) interconnects in and/or over the dielectric layer. For example, the interconnects 1023 may be formed. A plating process may be used to form the interconnects. Forming interconnects may include providing a patterned metal layer over an in the dielectric layer. Stage 11 of FIG. 10C illustrates and describes examples of forming interconnects The method may form additional dielectric layer(s) and additional interconnects as described at 1130 and 1135.

Once all the dielectric layer(s) and additional interconnects are formed, the method may decouple (e.g., remove, grind out) the carrier (e.g., 1100) from the dielectric layer 1020, leaving the substrate. In some implementation, the coreless substrate is an embedded trace substrate (ETS). Stage 12 of FIG. 10C illustrates and describes an example after a substrate is decoupled from a carrier.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 12:
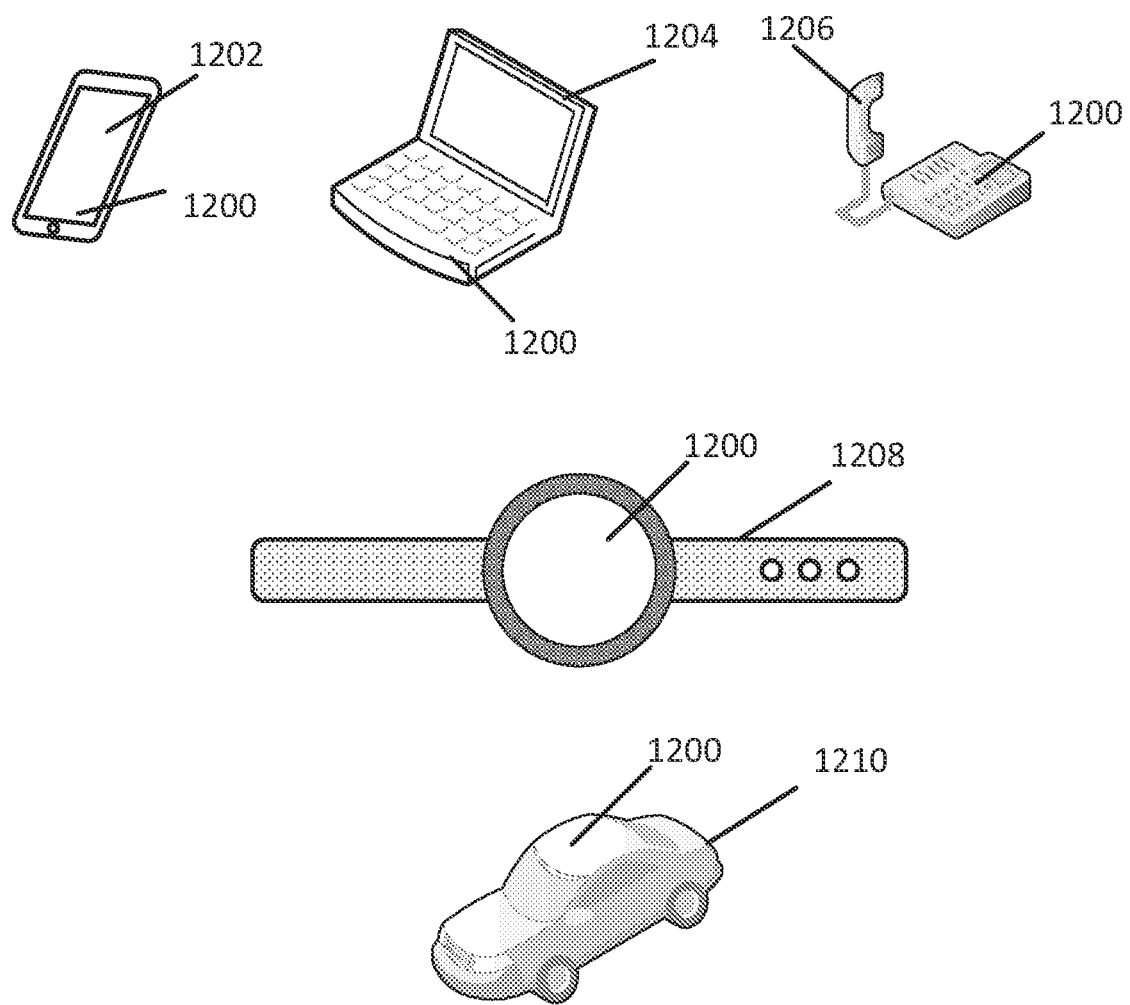
FIG. 12 illustrates various electronic devices that may integrate a die, an integrated device, an integrated passive device (IPD), a device package, a package, an integrated circuit and/or PCB described herein.

FIG. 12 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10C, and/or 11-12 may be rearranged and/or combined into a single component, process, feature or function or embodied in several components, processes, or functions. Additional elements, components, processes, and/or functions may also be added without departing from the disclosure. It should also be noted FIGS. 1-9, 10A-10C, and/or 11-12 and its corresponding description in the present disclosure is not limited to dies and/or ICs. In some implementations, FIGS. 1-9, 10A-10C, and/or 11-12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

One or more processors (e.g., core, integrated device) in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium.

The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may reside in a processing system, external to the processing system, or distributed across multiple entities including the processing system. The computer-readable medium may be embodied in a computer program product. In some examples, the computer-readable medium may be part of a memory. By way of example, a computer program product may include a computer-readable medium in packaging materials. Those skilled in the art will recognize how best to implement the described functionality presented throughout this disclosure depending on the particular application and the overall design constraints imposed on the overall system.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising an integrated device and a substrate coupled to the integrated device. The integrated device includes a first core and a second core. The substrate includes a first power interconnect configured to provide a first electrical path for a first power resource to the first core of the integrated device; a second power interconnect configured to provide a second electrical path for a second power resource to the second core of the integrated device; and a switch coupled to the first power interconnect and the second power interconnect, wherein if the switch is turned on, the switch is configured to enable at least some of the power resource from the second power resource to contribute to the first core of the integrated device.

Aspect 2: The package of aspect 1, wherein if the switch is turned off, the switch is configured such that the power from the second power resource does not contribute to the first core through the switch.

Aspect 3: The package of aspects 1 through 2, wherein the switch includes at least one transistor.

Aspect 4: The package of aspect 3, wherein the at least one transistor comprises a source interconnect, a drain interconnect, a channel, and a gate interconnect.

Aspect 5: The package of aspects 1 through 4, wherein the first power interconnect includes a first power plane, and wherein the second power interconnect includes a second power plane.

Aspect 6: The package of aspect 5, wherein the first power plane and the second power plane are located on a same metal layer of the substrate.

Aspect 7: The package of aspects 1 through 6, wherein the switch is configured to be controlled by the integrated device.

Aspect 8: The package of aspects 1 through 7, further comprising a second switch coupled to the first power interconnect and the second power interconnect, wherein if the second switch is turned on, the second switch is configured to enable at least some of the power resource from the second power resource to contribute to the first core of the integrated device.

Aspect 9: The package of aspects 1 through 7, wherein the integrated device further comprises a third core, wherein the substrate further comprises: a third power interconnect configured to provide a third electrical path for a third power resource to the third core of the integrated device; and a second switch coupled to the third power interconnect and the second power interconnect, wherein if the second switch is turned on, the second switch is configured to enable at least some of the power resource from the second power resource to contribute to the third core of the integrated device.

Aspect 10: The package of aspects 1 through 9, wherein the first power resource and the second power resource are part of a power grid resource that is configured to be coupled to one or more power management integrated devices.

Aspect 11: The package of aspects 1 through 10, wherein the first power resource includes a first electrical current from a power management integrated device, and wherein the second power resource includes a second electrical current from the power management integrated device.

Aspect 12: The package of aspects 1 through 11, wherein the integrated device is configured to: determine whether the first core of the integrated device needs more power; and if it is determined that the first core needs more power, turn on the switch to reroute some of the second power resource to the first core of the integrated device.

Aspect 13: The package of aspect 12, wherein the integrated device is further configured to: determine whether the first core of the integrated device does not need more power; and if it is determined that the first core does not need more power, turn off the switch to stop the rerouting of some of the second power resource to the first core of the integrated device through the switch.

Aspect 14: The package of aspect 13, wherein the integrated device is further configured to: determine whether the first core of the integrated device needs further power; and if it is determined that the first core needs further power, turn on a second switch coupled between the first power interconnect coupled to the first core and the second power interconnect coupled to the second core, to reroute more of the second power resource to the first core of the integrated device.

Aspect 15: A package comprising: a first integrated device; a second integrated device; and a substrate coupled to the first integrated device and the second integrated device, the substrate comprising: a first power interconnect configured to provide a first electrical path for a first power resource to the first integrated device; and a second power interconnect configured to provide a second electrical path for a second power resource to the second integrated device; and a switch coupled to the first power interconnect and the second power interconnect, wherein if the switch is turned on, the switch is configured to enable at least some of the power resource from the second power resource to contribute to the first integrated device.

Aspect 16: The package of aspect 15, wherein if the switch is turned off, the switch is configured such that the power from the second power resource does not contribute to the first integrated device through the switch.

Aspect 17: The package of aspects 15 through 16, wherein the switch includes at least one transistor.

Aspect 18: The package of aspect 17, wherein the at least one transistor comprises a source interconnect, a drain interconnect, a channel, and a gate interconnect.

Aspect 19: The package of aspects 15 through 18, wherein the switch is configured to be controlled by the first integrated device and/or the second integrated device.

Aspect 20: The package of aspects 15 through 19, wherein the first power resource and the second power resource are part of a power grid resource that is configured to be coupled to one or more power management integrated devices.

Aspect 21: The package of aspects 15 through 19, wherein the first power resource includes a first electrical current from a power management integrated device, and wherein the second power resource includes a second electrical current from the power management integrated device.

Aspect 22: The package of aspects 15 through 21, wherein the first integrated device is configured to: determine whether the integrated device needs more power; and if it is determined that the first integrated device needs more power, turn on the switch to reroute some of the second power resource to the first integrated device.

Aspect 23: The package of aspect 22, wherein the first integrated device is further configured to: determine whether the first integrated device does not need more power; and if it is determined that the first integrated device does not need more power, turn off the switch to stop the rerouting of some of the second power resource to the first integrated device through the switch.

Aspect 24: The package of aspect 23, wherein the first integrated device is further configured to: determine whether the first integrated device needs further power; and if it is determined that the first integrated device needs further power, turn on a second switch coupled between the first power interconnect coupled to the first integrated device and the second power interconnect coupled to the second integrated device, to reroute more of the second power resource to the first integrated device.

Aspect 25: The package of aspects 15 through 24, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 26: A method comprising: operating an integrated device that includes a first core and a second core, wherein a first power resource is directed to the first core and a second power resource is directed to the second core; determining that the first core of the integrated device needs more power; and turning on at least one switch to reroute some of the second power resource to the first core of the integrated device.

Aspect 27: The method of aspect 26, further comprising: determining that the first core of the integrated device does not need more power; and turning off the at least one switch to stop the rerouting of some of the second power resource to the first core of the integrated device through the at least one switch.

Aspect 28: The method of aspects 26 through 27, wherein turning on at least one switch includes turning on some but not all of the switches coupled between a first power interconnect coupled to the first core and a second power interconnect coupled to the second core.

Aspect 29: The method of aspect 28, further comprising: determining that the first core of the integrated device needs further power; and turning on all of the switches coupled between the first power interconnect coupled to the first core and the second power interconnect coupled to the second core, to reroute more of the second power resource to the first core of the integrated device through the at least one switch.

Aspect 30: The method of aspects 26 through 29, wherein the first power resource and the second power resource travel through a power management integrated device.

Aspect 31: A method comprising: operating a first integrated device, wherein a first power resource is directed to the first integrated device; operating a second integrated device, wherein a second power resource is directed to the second integrated device; determining that the first integrated device needs more power; and turning on at least one switch to reroute some of the second power resource to the first integrated device through the at least one switch.

Aspect 32: The method of aspect 31, further comprising: determining that the first integrated device does not need more power; and turning off the at least one switch to stop the rerouting of some of the second power resource to the first integrated device through the at least one switch.

Aspect 33: The method of aspects 31 through 32, wherein turning on at least one switch includes turning on some but not all of the switches coupled between a first power interconnect coupled to the first integrated device and a second power interconnect coupled to the second integrated device.

Aspect 34: The method of aspect 33, further comprising: determining that the first integrated device needs further power; and turning on all of the switches coupled between the first power interconnect coupled to the first integrated device and the second power interconnect coupled to the second integrated device, to reroute more of the second power resource to the first integrated device through the at least one switch.

Aspect 35: The method of aspects 31 through 34, wherein the first power resource and the second power resource travel through a power management integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
an integrated device comprising:
    a first core; and
    a second core; and
a substrate coupled to the integrated device, the substrate comprising:
    a first power interconnect configured to provide a first electrical path for a first power resource to the first core of the integrated device;
    a second power interconnect configured to provide a second electrical path for a second power resource to the second core of the integrated device;
    a first switch coupled to the first power interconnect and the second power interconnect, wherein if the first switch is turned on, the first switch is configured to enable at least some power resource from the second power resource to contribute to the first core of the integrated device; and
    a second switch coupled to the first power interconnect and the second power interconnect, wherein if the second switch is turned on, the second switch is configured to enable at least some power resource from the second power resource to contribute to the first core of the integrated device.

2. The package of claim 1,
wherein if the first switch is turned off, the first switch is configured such that power from the second power resource does not contribute to the first core through the first switch, and
wherein if the second switch is turned off, the second switch is configured such that power from the second power resource does not contribute to the first core through the second switch.

3. The package of claim 1,
wherein the first switch includes at least one first transistor, and
wherein the second switch includes at least one second transistor.

4. The package of claim 1, wherein the first switch and/or the second switch are configured to be controlled by the integrated device.

5. The package of claim 1,
wherein the integrated device further comprises a third core,
wherein the substrate further comprises:
    a third power interconnect configured to provide a third electrical path for a third power resource to the third core of the integrated device; and
    a third switch coupled to the third power interconnect and the second power interconnect, wherein if the third switch is turned on, the third switch is configured to enable at least some power resource from the second power resource to contribute to the third core of the integrated device.

6. The package of claim 1, wherein the first power resource and the second power resource are part of a power grid resource that is configured to be electrically coupled to one or more power management integrated devices.

7. A package comprising:
a first integrated device;
a second integrated device; and
a substrate coupled to the first integrated device and the second integrated device, the substrate comprising:
    a first power interconnect configured to provide a first electrical path for a first power resource to the first integrated device, wherein the first power interconnect includes a first power plane;
    a second power interconnect configured to provide a second electrical path for a second power resource to the second integrated device, wherein the second power interconnect includes a second power plane; and
    a switch coupled to the first power interconnect and the second power interconnect, wherein if the switch is turned on, the switch is configured to enable at least some power resource from the second power resource to contribute to the first integrated device.

8. The package of claim 7, wherein if the switch is turned off, the switch is configured such that power from the second power resource does not contribute to the first integrated device through the switch.

9. The package of claim 7, wherein the first power plane and the second power plane are located on a same metal layer of the substrate.

10. The package of claim 7, wherein the switch is configured to be controlled by the first integrated device and/or the second integrated device.

11. The package of claim 7, wherein the first power resource and the second power resource are part of a power grid resource that is configured to be electrically coupled to one or more power management integrated devices.

12. A package comprising:
a first integrated device;
a second integrated device; and
a substrate coupled to the first integrated device and the second integrated device, the substrate comprising:
  a first power interconnect configured to provide a first electrical path for a first power resource to the first integrated device;
  a second power interconnect configured to provide a second electrical path for a second power resource to the second integrated device;
  a first switch coupled to the first power interconnect and the second power interconnect, wherein if the first switch is turned on, the first switch is configured to enable at least some power resource from the second power resource to contribute to the first integrated device; and
  a second switch coupled to the first power interconnect and the second power interconnect, wherein if the second switch is turned on, the second switch is configured to enable at least some power resource from the second power resource to contribute to the first integrated device.

13. The package of claim 12,
wherein if the first switch is turned off, the first switch is configured such that power from the second power resource does not contribute to the first integrated device through the first switch, and
wherein if the second switch is turned off, the second switch is configured such that power from the second power resource does not contribute to the first integrated device through the second switch.

14. The package of claim 12, wherein the first switch and/or the second switch are configured to be controlled by the first integrated device and/or the second integrated device.

15. A method comprising:
operating an integrated device that includes a first core and a second core, wherein a first power resource is directed to the first core and a second power resource is directed to the second core; and
turning on at least one switch to reroute some of the second power resource to the first core of the integrated device, wherein turning on at least one switch includes turning on some but not all of the switches coupled between a first power interconnect coupled to the first core and a second power interconnect coupled to the second core;
wherein rerouting some of the second power resource to the first core of the integrated device includes providing a higher voltage and/or more current to the first core of the integrated device.

16. The method of claim 15, further comprising turning off one or more switches to stop the rerouting of at least some of the second power resource to the first core of the integrated device.

17. The method of claim 15, wherein turning on at least one switch includes turning on all of the switches coupled between a first power interconnect coupled to the first core and a second power interconnect coupled to the second core.

18. The method of claim 15, further comprising turning on all of the switches coupled between the first power interconnect coupled to the first core and the second power interconnect coupled to the second core, to reroute more of the second power resource to the first core of the integrated device.

19. The method of claim 18, wherein turning on all of the switches coupled between the first power interconnect coupled to the first core and the second power interconnect coupled to the second core, is performed after determining to provide more power to the first core of the integrated device.

20. The method of claim 15, wherein the first power resource and the second power resource are configured to travel through a power management integrated device.

21. The method of claim 15, wherein turning on at least one switch is performed after determining to provide more power to the first core of the integrated device.

22. A method comprising:
operating a first integrated device, wherein a first power resource is directed to the first integrated device;
operating a second integrated device, wherein a second power resource is directed to the second integrated device; and
turning on at least one switch to reroute some of the second power resource to the first integrated device, wherein turning on at least one switch includes turning on some but not all of the switches coupled between a first power interconnect coupled to the first integrated device and a second power interconnect coupled to the second integrated device;
wherein rerouting some of the second power resource to the first integrated device includes providing a higher voltage and/or more current to the first integrated device.

23. The method of claim 22, further comprising turning off one or more switches to stop the rerouting of at least some of the second power resource to the first integrated device.

24. The method of claim 22, wherein turning on at least one switch includes turning on all of the switches coupled between a first power interconnect coupled to the first integrated device and a second power interconnect coupled to the second integrated device.

25. The method of claim 22, further comprising turning on all of the switches coupled between the first power interconnect coupled to the first integrated device and the second power interconnect coupled to the second integrated device, to reroute more of the second power resource to the first integrated device.

26. The method of claim 25, wherein turning on all of the switches is performed after determining to provide more power to the first integrated device.

27. The method of claim 22, wherein the first power resource and the second power resource are configured to travel through a power management integrated device.

28. The method of claim 22, wherein turning on at least one switch is performed after determining to provide more power to the first integrated device.

* * * * *